United States Patent [19]

Huang et al.

[11] Patent Number: 4,570,174
[45] Date of Patent: Feb. 11, 1986

[54] VERTICAL MESFET WITH AIR SPACED GATE ELECTRODE

[75] Inventors: Ho-Chung Huang, Princeton Junction; Ralph J. Matarese, Trenton, both of N.J.

[73] Assignee: The United States of America as represented by the Secretary of the Army, Washington, D.C.

[21] Appl. No.: 652,542

[22] Filed: Sep. 20, 1984

Related U.S. Application Data

[63] Continuation of Ser. No. 295,191, Aug. 21, 1981, abandoned.

[51] Int. Cl.$^4$ .................... H01L 29/80; H01L 29/08; H01L 29/56
[52] U.S. Cl. ........................ 357/22; 357/55; 357/56; 357/68; 357/69; 357/41
[58] Field of Search .............. 357/22, 55, 56, 68, 357/69, 41

[56] References Cited

U.S. PATENT DOCUMENTS

| | | | |
|---|---|---|---|
| 2,930,950 | 3/1960 | Teszner | 357/22 |
| 3,636,420 | 1/1972 | Vendelin et al. | 357/68 |
| 3,761,785 | 9/1973 | Pruniaux | 357/22 |
| 3,786,560 | 1/1974 | Cunningham | 357/55 |
| 3,851,379 | 12/1974 | Gutknecht et al. | 29/571 |
| 3,861,024 | 1/1975 | Napoli et al. | 29/579 |
| 3,943,622 | 3/1976 | Kim et al. | 357/22 |
| 4,129,879 | 12/1978 | Tantraporn et al. | 357/56 |

FOREIGN PATENT DOCUMENTS 53-84570 7/1978 Japan .................... 357/22

OTHER PUBLICATIONS

Hochberg et al., "Fabrication of MOS Devices with Closer Source-Drain Spacing" IBM Tech. Discl. Bull., vol. 10, No. 5, Oct., 1967, pp. 653-654.
Chemical Abstracts, vol. 96, No. 16, 76-Electric Phenomena, p. 801, 134391u (refers to NTIS order No. Pat-Appl.-6-295191 published 1-15-82).

Primary Examiner—William D. Larkins
Assistant Examiner—John Lamont
Attorney, Agent, or Firm—Anthony T. Lane; Jeremiah G. Murray; Edward Goldberg

[57] ABSTRACT

A high power high frequency field effect transistor is achieved with a vertical structure of gallium arsenide including a semi-insulating substrate, a conductive layer over the substrate, a narrow-central post having small metal gate electrodes on each side, metal drain electrodes on the conductive layer spaced from the central post and a metal source electrode supported on the central post. A deep channel around the post separates the metal drains, gates and source. Increased power is obtained from a cellular unit including two parallel source stripes, four gates and three drains. The drains are connected together by the conductive layer and a drain pad at one end, and the gates are connected at the other end by a gate pad on an outer region of the substrate. The gate connections to the pad are isolated from the conductive layer by a bridge over a space etched in the lower layer. A method for fabrication of this structure is also provided.

3 Claims, 6 Drawing Figures

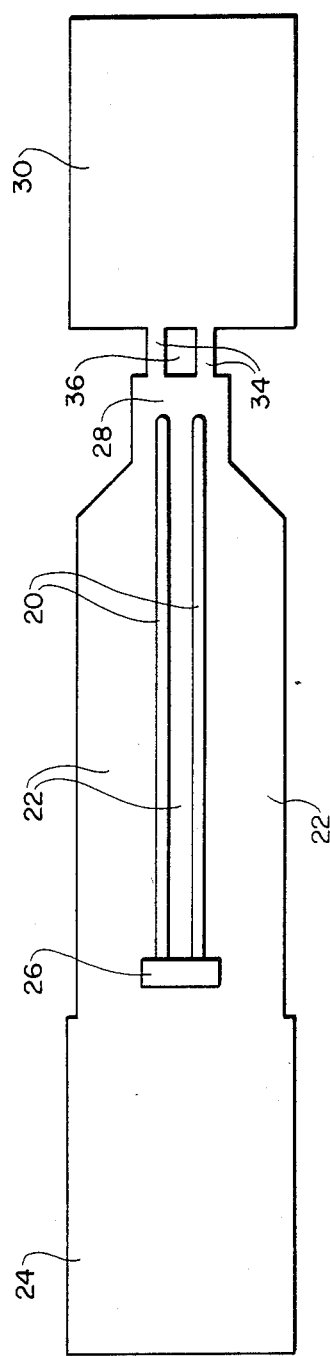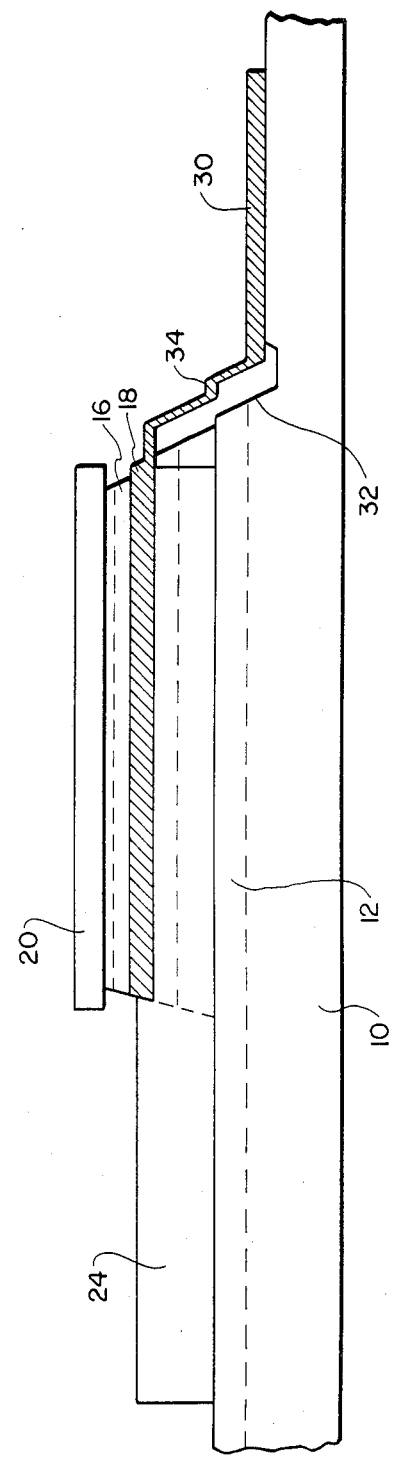

VERTICAL MESFET WITH AIR SPACED GATE ELECTRODE

The Government has rights in this invention pursuant to contract No. DAAB07-73-C-0162 awarded by the Department of the Army.

This application is a continuation of application Ser. No. 295,191, filed Aug. 21, 1981, now abandoned.

FIELD OF THE INVENTION

The invention relates to high frequency, high power field effect transistors and particularly to a vertical metal semiconductor barrier gate type formed of gallium arsenide.

BACKGROUND OF THE INVENTION

Recent developments in microwave semiconductor devices have included the use of silicon bipolar transistors as amplifiers in place of traveling wave tubes for high frequency communications systems and radar. As dimensions become smaller, base resistance and emitter injection efficiency considerations limit the speed of bipolar transistors. Field effect transistors (FETs) however, do not have such limitations and can achieve higher powers at higher operating frequencies. One known type of FET structure is the planar or epitaxial type having source and drain electrodes on a common surface layer separated by a groove containing a gate or control electrode, with current flow parallel to the common surface. A second type is the vertical structure in which source and drain are positioned in different vertical layers with current flow perpendicular to that epitaxial surface. The gate electrode is also in a groove between the source and drain. Both types include an insulator or Shottky barrier to the flow of current interposed between the gate and drain which provides a diode type characteristic. Examples of each of the FET structures are found in U.S. Pat. No. 3,861,024 which relates to a planar configuration and U.S. Pat. No. 3,851,379 which describes a vertical metal oxide silicon device. The vertical structure provides several advantages including greater packing density, low thermal resistance, low output conductance with increased output power, less interface and spacing problems to enable attainment of high electron mobility and gain, carrier concentration can be tailored along the path of electron flow to increase breakdown voltage and maximum power, and very short gates can be used for mm wave applications. It is also known that gallium arsenide has superior semiconducting properties as compared with silicon. These include an electron mobility five times higher and a peak velocity twice that of silicon.

SUMMARY OF THE INVENTION

It is therefore the primary object of the present invention to provide an improved high frequency, high power vertical metal semiconductor field effect transistor.

It is another object of this invention to provide a vertical metal semiconductor field effect transistor of gallium arsenide.

A further object of this invention is to provide a method for processing a high frequency high power vertical metal semiconductor barrier gate field effect transistor.

These objects are achieved with a unique layered structure including a semi-insulating gallium arsenide substrate, an n+ conductive layer over the substrate, a narrow central post having an n and n+ region on the conductive layer, a pair of small metal gate electrodes on each side of the central post, metal drain electrodes on the conductive layer spaced from the central post, and an overhanging metal source electrode on the central post. A channel formed around the post separates the drain, gate and source electrodes. A plurality of units are combined in cells having two parallel source stripes, four gates and three drains, to provide increased power. The drains are connected by the conductive layer and a pad at one end, and the gates connected by a pad on an outer region of the substrate at the other end. A space etched in the lower layer isolates the gate connections from the conductive layer with the connections forming a bridge to the outer pad. A series of metal evaporation, photolithographic and etching steps provide the narrow post, separate drains and undercut source electrode and gate connections. The gates are evaporated at an angle under the source onto opposite sides of the post. Other objects and advantages will become apparent from the following description taken in conjunction with the accompanying drawings.

BRIEF DESCRIPTION OF THE DRAWINGS

FIG. 2 is a plan view of a vertical field effect transistor cell including two complete devices of the type shown in FIG. 1;

FIG. 3 is a partial cross-sectional side view of the vertical field effect transistor cell of FIG. 2.

DESCRIPTION OF THE PREFERRED EMBODIMENT

Figure 1:
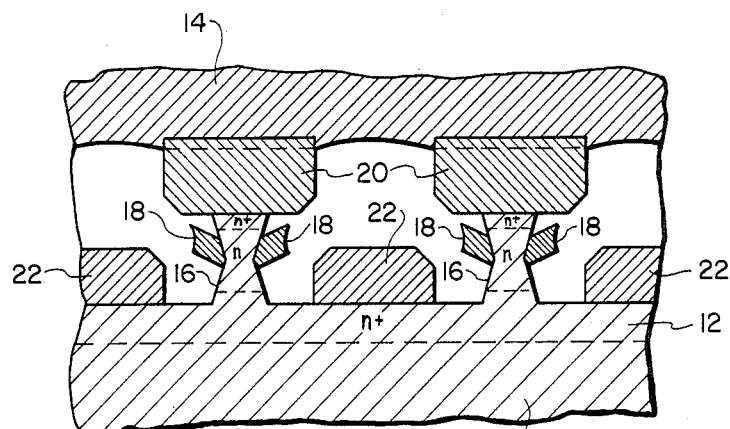
FIG. 1 is a cross-sectional end view of the semiconductor layered structure including portions of two parallel vertical field effect transistors in accordance with the present invention.

As shown in FIG. 1, two parallel vertical field effect transistors include a common semi-insulating substrate 10, preferably of gallium arsenide, a lower common n+ conductive layer 12 over the substrate, and a common upper ground plane and heat sink 14. Each individual VFET includes a narrow semiconducting post 16 of n and n+ layers on the conductive layer 12 and a pair of metal gate electrodes 18 on opposite sides of each post. A metal source electrode 20 is supported on each post and connected to the common ground and heat sink 14. Three metal drain electrodes 22 are positioned on the conductive layer 12 intermediate and spaced from each side of each post 16. Each VFET operates in conjunction with the two adjacent drains. The drains are internally connected through ohmic contacts to the lower n+ layer 12 and by a drain pad 24 shown in FIG. 2.

The GaAs wafer includes the semi-insulating substrate 10, n+ conductive layer 12, and n and n+ layers of post 16 which are grown by a known vapor hydride process. The carrier concentration in the n layer can be a function of distance along the path of electron flow from source to drain for optimal performance. The n+ layers may be defined as having a relatively large number of negatively charged carriers or large doping density, while the n layer has a relatively small number of charged carriers or small doping density. The semi-insulating substrate is considered neutral. The presence of the n+ layer under the drain ohmic contacts effectively isolates the active n region from the influence of the semi-insulating substrate. Since there are two gates, one on each side of the post 16, the effective thickness of the post for each gate is one half that of the actual thickness between the two gates. This provides a narrow conduction path that permits greater control of current by the gate electrodes.

In order to achieve high output power, a plurality of source stripes 20 are connected in parallel to form a cell which includes two VFETs as shown in FIG. 2. Each cell includes two source stripes, four gates and three drains. The three drains 22 are connected by the lower n+ layer 12 and the drain pad 24. An open area or hole 26 separates the ends of the source electrodes from the drain electrode areas to prevent short circuits. The gates 18 along each side of each post 16 below each source 20 are connected around the opposite ends 28 and by a gate pad 30. To isolate the gate metal electrodes and to prevent short-circuiting to the lower n+ layer, the gate transition region is shifted outside the active area. This is accomplished by etching the GaAs under the end region 32, as shown in FIG. 3, to form a suspension bridge 34 joining the gates to the pad 30 over the bottom layer 12. Pad 30 is connected to substrate 10. An additional hole 36 aids in the etching of the undercut 32. The source material is preferably of a titanium-palladium-gold mixture, while the drains and gates are preferably of titanium and gold. A GaAs chip may include four like cells and different cells can be connected in parallel through external connections.

Figure 4A:
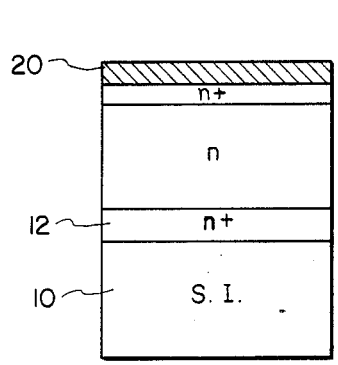
FIGS. 4a, 4b, and 4c show cross-sectional end views of steps in the process of fabricating the device of FIG. 1.
Figure 4B:
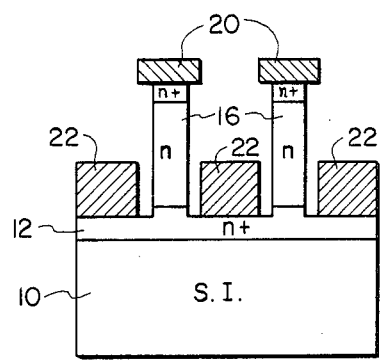
Figure 4C:
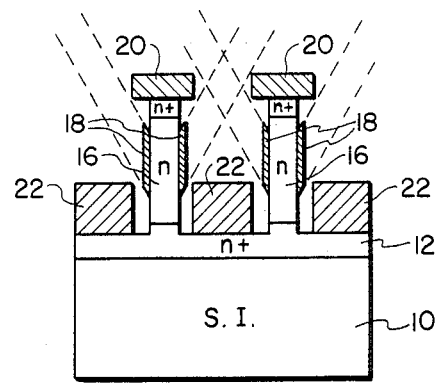

FIGS. 4a, 4b and 4c illustrate the key processing steps. Starting with a wafer of GaAs having an n+ layer ($5 \times 10^{18}$ cm$^{-3}$, 0.5 um), an n layer ($5 \times 10^{15}$ cm$^{-3}$, 3 um) and an n+ layer ($5 \times 10^{18}$ cm,$^{-3}$, 1.0 um) over a semi-insulating GaAs substrate, a Ti-Pd-Au ohmic contact metallization 20 is evaporated on the top of the n+ surface, as shown in FIG. 4a. Using photolithographic techniques, parallel source contact stripes about 4 um wide, are defined. The contact metallization, n+ and n layers are etched through by ion beam or chemical etching, leaving about 1 um thick of n layer remaining. After a subsequent photo-lithographic process, the n layer along the sides of the source stripes is etched away until the n+ is exposed, while the n layer at the end of the source stripes is protected by the photoresist. This n layer at the end of the source stripes is used later for the transition of the gate from the n layer to the semi-insulating substrate without contacting the bottom n+ layer. As the etch proceeds down through the layers it also etches sideways to undercut the source contact, as shown in FIG. 4b. This thins out the post 16 which supports the source contact. The etch is continued and monitored until the post thickness is approximately 1 um wide. For optimal x-band operation this thickness should be about 0.5 um.

A second evaporation of Ti-Au then deposits the three drain ohmic contacts 22 on the lower n+ layer 12. The relatively deep hole in the GaAs and large undercut assures that the metal drain is separated at all positions from the metal of the top source. A drain metal pad is deposited and patterned to be removed by etching at one end of the source stripes to form a set of interconnected drain fingers along, beside and below the source stripes.

As shown in FIG. 4c, two additional evaporations of Ti-Au are each done at a steep angle to the normal to deposit gate electrodes 18 on both sides of the semiconducting posts which support source electrodes 20. The angle is set so that the gates are completely separated from both of the previous source and drain metallizations. Since the gate length is determined by the source-to-drain opening and angle of gate evaporation, a gate length as small as 0.5 um can be achieved which permits use at mm wave frequencies.

As a final step, a photoresist pattern defines the gate bonding pad 30 shown in FIGS. 2 and 3. In order to prevent the gate metallization from shorting to the lower n+ layer 12, the transition region is shifted to outside the active area. The GaAs end region 32 under the gate transition area is etched away to leave a suspension metal bridge 34 above the layer 12 to connect to metal pad 30 on an outer region of substrate 10. The bridge portion thus spans the n+ semi-insulating transition region without touching the layer 12. The thickness of the metal bridge should be about 2000 Å for adequate mechanical rigidity.

The present invention thus provides an improved vertical field effect transistor structure and method of fabrication which achieves relatively high power at high frequencies. While only a single embodiment has been illustrated and described, it is apparent that other variations may be made in the particular design, configuration and method, without departing from the scope of the invention as set forth in the appended claims.

What is claimed is:

1. A semiconductor field effect transistor device comprising:
   a semi-insulating substrate layer;
   a first common conductive layer of an n+ conductivity type semiconductor material having a relatively large number of charged carriers on said semi-insulating layer;
   a first narrow post extending upright from said first conductive layer, said narrow post including an intermediate layer of n conductivity type material having a relatively small number of charged carriers on said layer and a second conductive layer of said n+ conductivity type having a relatively large number of charged carriers on said intermediate layer;
   a first source electrode on said second conductive layer, including a metal heat sink and ground layer on said source electrode;
   a first pair of gate electrodes disposed respectively on and extending along opposite sides of said narrow post intermediate layer;
   a pair of drain electrodes extending from and along the upper surface of said first conductive layer, each drain electrode being positioned adjacent a respective side of said post and being displaced laterally from said post and spaced from respective gate electrodes and from said source electrode;
   first means at one end of said device connecting said drain electrodes together;
   a second means at the other end connecting said gate electrodes together and to said substrate layer;
   a second narrow post spaced along said first conductive layer from said first post, said second post including respective intermediate and second conductive layers, a second source electrode disposed on said second narrow post second conductive layer, said source electrodes being connected to said metal heat sink and ground layer, a second pair of gate electrodes disposed on opposite sides of said second narrow post, a third drain electrode extending from said first conductive layer, a first drain electrode of said pair being positioned between and spaced from said first and second narrow posts, said second and third drain electrodes being positioned adjacent and displaced laterally outward from respective sides of said posts, said posts and electrodes forming a cell of two vertical field effect transistors;

said first means including a metal drain pad at one end of said cell on said first conductive layer having connections to said three drain electrodes spaced from said source electrodes, said second means including a metal gate pad at the other end of said cell on said substrate layer having connections to said gate electrodes; and an undercut through said first conductive layer at said other end providing a space between said gate electrode connections and said first conductive layer, said gate electrode connections providing a connecting metal bridge between said gate pad and gate electrodes over said space without contacting said first conductive layer.

2. The device of claim 1 wherein said substrate and semi-conductor layers are of gallium arsenide.

3. The device of claim 2 wherein said source, gate and drain electrodes are of metal.

* * * * *